(12) United States Patent
Dmytriw et al.

(10) Patent No.: US 10,678,352 B2
(45) Date of Patent: Jun. 9, 2020

(54) VIRTUAL TOUCH KNOB ASSEMBLY

(71) Applicant: DIEHL AKO STIFTUNG & CO. KG, Wangen (DE)

(72) Inventors: Anthony Dmytriw, Dekalb, IL (US); Robert Alvord, Elmwood Park, IL (US); Sam Toktaeng, Westmont, IL (US); Ralph Stohr, Leutkirch (DE); Joachim Lyszus, Baindt (DE); Bruno Fuhge, Achberg (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 574 days.

(21) Appl. No.: 14/665,151

(22) Filed: Mar. 23, 2015

(65) Prior Publication Data
US 2015/0193073 A1    Jul. 9, 2015

Related U.S. Application Data

(63) Continuation of application No. PCT/US2012/056535, filed on Sep. 21, 2012.

(51) Int. Cl.
*G06F 3/038* (2013.01)
*G06F 3/0354* (2013.01)
*H03K 17/96* (2006.01)
*G06F 3/0488* (2013.01)

(52) U.S. Cl.
CPC .......... *G06F 3/03547* (2013.01); *G06F 3/038* (2013.01); *G06F 3/04883* (2013.01); *H03K 17/9622* (2013.01); *H03K 2217/96066* (2013.01)

(58) Field of Classification Search
CPC ...... H03K 17/9622; H03K 2217/96066; G06F 3/04883
See application file for complete search history.

(56) References Cited

U.S. PATENT DOCUMENTS

| 4,067,007 | A | * | 1/1978 | Bryden | ..................... G01S 7/24 341/114 |
| 5,959,610 | A | * | 9/1999 | Silfvast | .................. H01H 19/00 345/156 |
| 6,496,790 | B1 | * | 12/2002 | Kathavate | ............ G01R 31/317 702/188 |
| 7,720,552 | B1 | | 5/2010 | Lloyd | |
| 7,932,897 | B2 | * | 4/2011 | Elias | ....................... G06F 3/044 345/174 |

(Continued)

FOREIGN PATENT DOCUMENTS

| CN | 102106085 A | 6/2011 |
| JP | 09060419 A | 3/1997 |

(Continued)

*Primary Examiner* — William Boddie
*Assistant Examiner* — Jeffrey Parker
(74) *Attorney, Agent, or Firm* — Laurence A. Greenberg; Werner H. Stemer; Ralph E. Locher

(57) ABSTRACT

A virtual touch knob assembly is provided that translates sensed movement of a user's fingers around a knob into control signals for operation of an appliance. A knob is provided on a user control panel of an appliance. The knob is fixed, i.e., does not turn or rotate. A system is provided that can sense the user's fingers moving around the fixed knob and translate the sensed input to control signals for setting the operation of the appliance or device.

16 Claims, 5 Drawing Sheets

(56) References Cited

U.S. PATENT DOCUMENTS

| | | | |
|---|---|---|---|
| 2009/0009491 A1* | 1/2009 | Grivna | G06F 3/033 |
| | | | 345/184 |
| 2010/0156839 A1* | 6/2010 | Ellis | G06F 1/3203 |
| | | | 345/174 |
| 2010/0253653 A1 | 10/2010 | Stambaugh et al. | |
| 2011/0100353 A1 | 5/2011 | Rauth et al. | |
| 2011/0240455 A1 | 10/2011 | Kulczycki et al. | |
| 2012/0226977 A1* | 9/2012 | Lengeling | G06F 3/04883 |
| | | | 715/702 |

FOREIGN PATENT DOCUMENTS

| | | |
|---|---|---|
| JP | 2007080778 A | 3/2007 |
| KR | 1020110067246 A | 6/2011 |
| WO | 2010115014 A1 | 10/2010 |

* cited by examiner

VIRTUAL TOUCH KNOB ASSEMBLY

CROSS-REFERENCE TO RELATED APPLICATION

This is a continuation application, under 35 U.S.C. § 120, of copending international application No. PCT/US2012/056535, filed Sep. 21, 2012, which designated the United States.

BACKGROUND OF THE INVENTION

Field of the Invention

The instant invention relates to a virtual touch knob assembly, and more particularly, to a virtual touch knob assembly that translates sensed movement of a user's fingers around a knob into control signals for operation of an appliance.

Generally, electro-mechanical knobs have traditionally been provided on the user interface panel for consumer electronics and appliances. However, electro-mechanical knobs can experience wear. Additionally, such knobs require mounting holes in the panels to which they are mounted. Such holes can allow water or chemicals to enter the control panel of the appliance, which can harm the electronics. Typically, electro-mechanical encoders having mechanical, turning knobs are based around bulky mechanical designs in which encoders have been implemented to withstand the mechanical movement stresses and to block the ingress areas.

What is needed is a knob system for appliances that does not suffer from mechanical wear and/or provide an ingress to the appliance for contaminants.

PCT Patent Publication No. WO 2010/115014 A1 discloses a virtual knob interface including a substrate, a virtual knob associated with the substrate, and a number of touch sensors associated with the substrate and with the virtual knob. The virtual knob and touch sensors are configured and arranged such that the touch sensors detect manipulation of the virtual knob by a user. The knob can be removable from the substrate. Features can be provided to disable control of device or function controlled by the knob when the knob has been removed. FIGS. 1F-1G of PCT Patent Publication No. WO 2010/115014 A1 illustrate an alternate embodiment wherein the virtual knob is integrally formed with the substrate. In such an embodiment, touch sensors can be arranged in the interior region of the virtual knob. According to paragraph [0026] of PCT Patent Publication No. WO 2010/115014 A1, the touch sensors could be tuned or calibrated such that they would not be actuated by touch or proximity to portions of the virtual knob or substrate other than the portions directly overlying the touch sensors or the sensing electrodes thereof.

What is further needed is a system and method to realize the "turning" direction of a virtual touch knob for use in controlling the settings of an appliance or device.

SUMMARY OF THE INVENTION

It is accordingly an object of this invention to provide a virtual touch knob assembly that overcomes the disadvantages of the prior art. In one embodiment of the invention, a virtual touch knob is provided on a user interface of a device or appliance, such as a refrigerator, freezer, washing machine, dryer, dishwasher, oven, stovetop, AN device, etc. The virtual touch knob is fixed, i.e., does not rotate to the front panel of a user interface for the appliance or device. Capacitive plates or keys embedded in the cylindrical body of the virtual touch knob are cyclically polled by a processor to determine, from a sensed change in capacitance for a particular key, whether one or more keys have been passed over by a finger of user. The system of the present invention utilizes this information to determine a "turning" direction or "virtual turning direction" of the virtual touch knob and to provide this information to the control system of the appliance or device, for use in controlling the settings of the appliance or device.

In one particular embodiment of the invention, a virtual touch knob assembly, is provided that includes, a virtual touch knob including a plurality of conductive plates around a cylindrical portion of the knob, a processor configured to read each of the plurality of conductive plates in a predetermined sequence and to determine whether a capacitance level has changed for one or more of the conductive plates, the processor configured to store in a state register, for each of the plurality of conductive plates, a value indicative of whether or not a capacitance level changed for a respective one of the plurality of conductive plates and, based on the values in the state register, to determine a virtual turning direction of the virtual touch knob.

In the context of the present invention, a "virtual turning direction" or a "turning direction of the virtual touch knob" is used to indicate a direction of clockwise or counter-clockwise movement of an object, typically the fingers of a user, about the cylindrical body portion of the virtual touch knob.

Other features which are considered as characteristic for the invention are set forth in the appended claims.

Although the invention is illustrated and described herein as embodied in a virtual touch knob assembly, it is nevertheless not intended to be limited to the details shown, since various modifications and structural changes may be made therein without departing from the spirit of the invention and within the scope and range of equivalents of the claims.

The construction of the invention, however, together with the additional objects and advantages thereof will be best understood from the following description of the specific embodiments when read in connection with the accompanying drawings.

BRIEF DESCRIPTION OF THE SEVERAL VIEWS OF THE DRAWING

The present invention is illustrated by way of example, and not by way of limitation, in the figures of the accompanying drawings, in which like reference numerals refer to similar elements and in which.

DETAILED DESCRIPTION OF THE INVENTION

Figure 1:
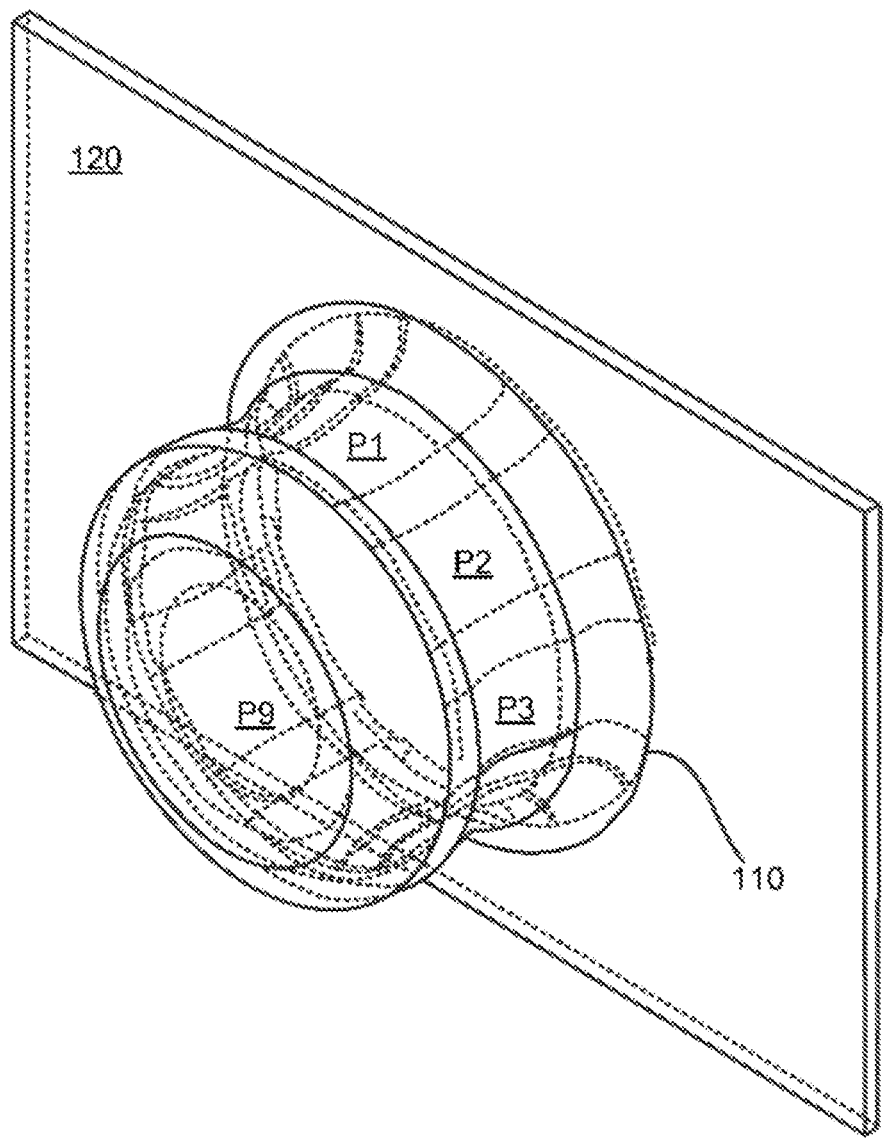
FIG. 1 is a perspective view of a virtual touch knob in accordance with one particular embodiment of the present invention.
Figure 2:
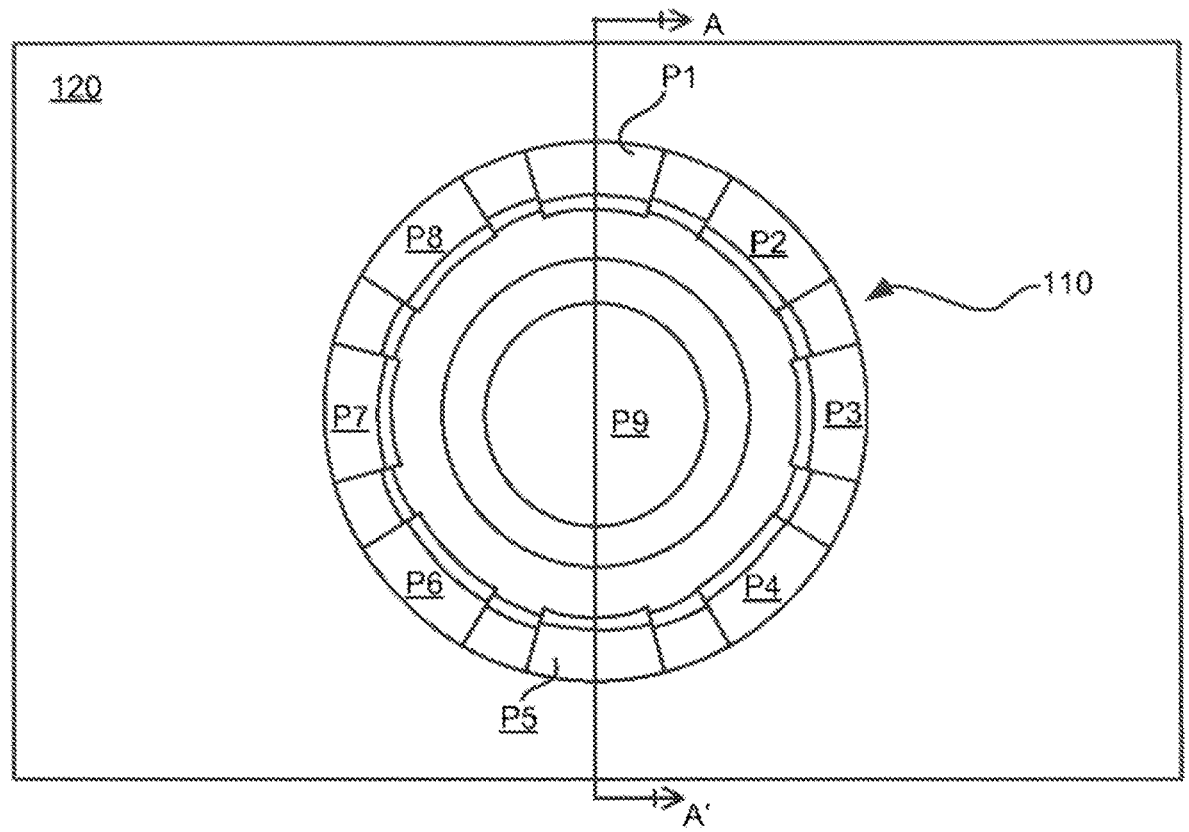
FIG. 2 is a rear plan view of a virtual touch knob in accordance with one particular embodiment of the present invention.
Figure 3:
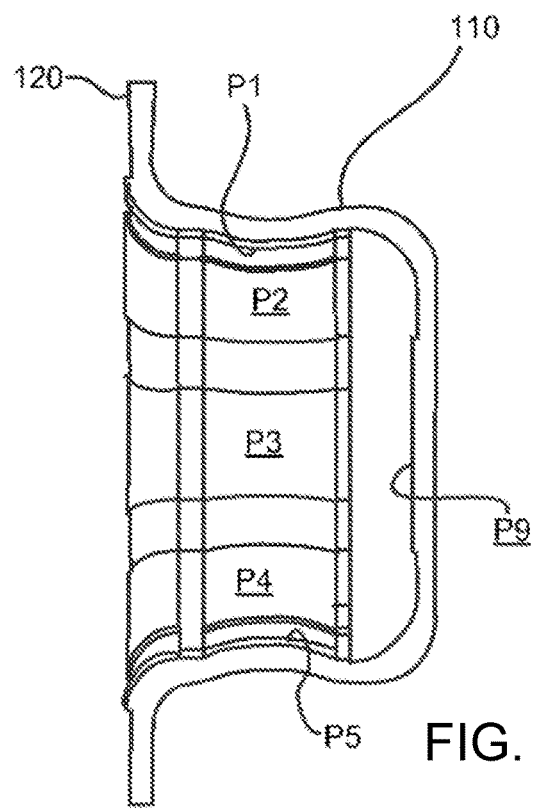
FIG. 3 is a cross-sectional view of the virtual touch knob of FIG. 2, taken along the section line A-A' of FIG. 2.
Figure 4:
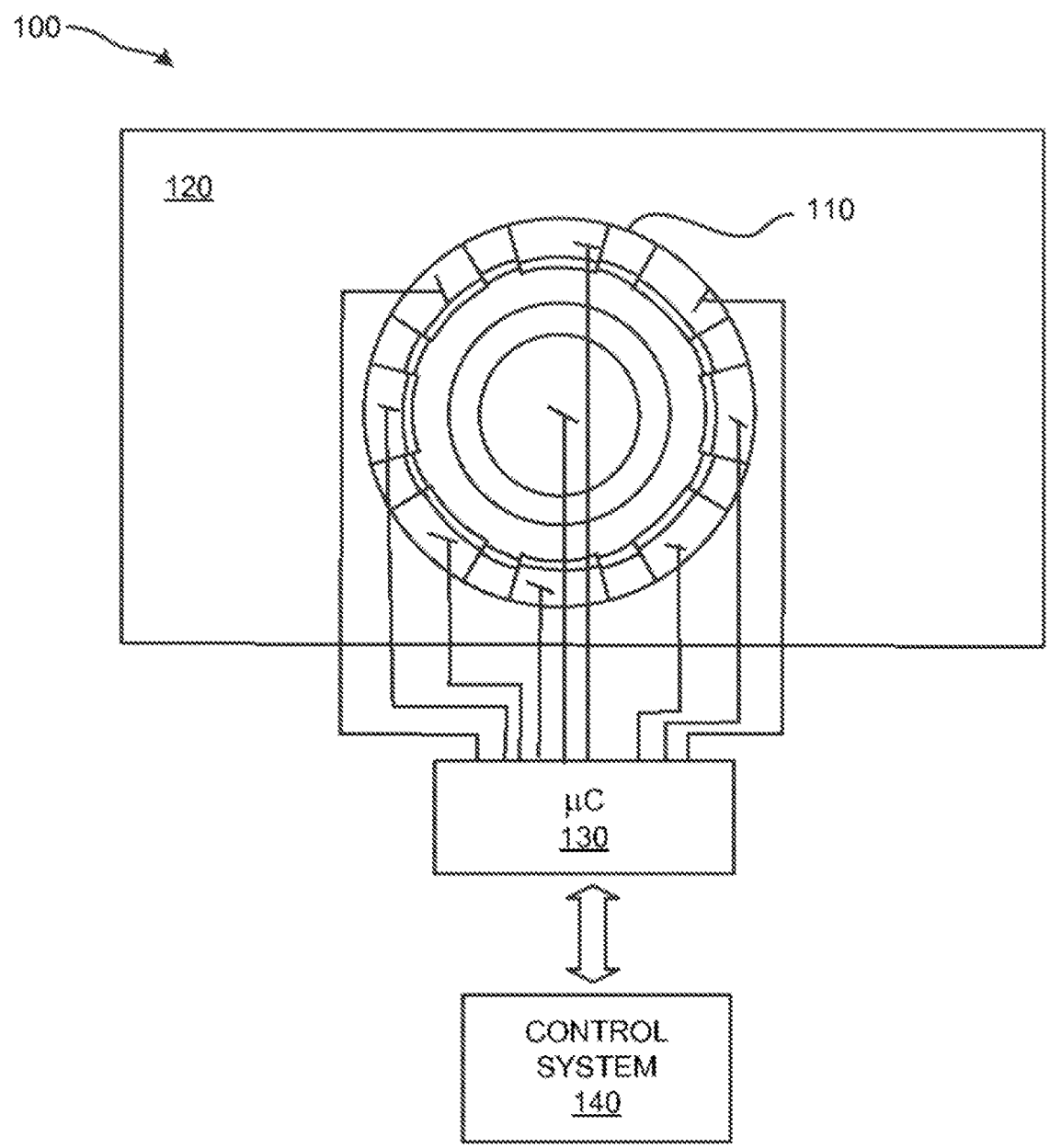
FIG. 4 is a generalized diagram of a virtual touch knob assembly in accordance with one particular embodiment of the invention.

Referring now to FIGS. 1-4, there is shown a virtual touch knob assembly 100, in accordance with one particular embodiment of the present invention, that can be used to control the settings of appliances or other electrical devices. A protruding knob-like feature or virtual touch knob 110 is provided on a front panel 120 of a user interface. In one particularly preferred embodiment, the virtual touch knob 110 can be molded into the front panel 120. In the present embodiment, the virtual touch knob 110 will not rotate. Rather, sensors within the virtual touch knob 110 will sense a user's fingers moving around the outer perimeter of the virtual touch knob 110, the user's fingers simulating a turning motion. The virtual touch knob assembly 100 will utilize signals from the sensors indicative of the user's fingers moving around the virtual touch knob to electronically switch the appliance or device in a similar manner as with conventional electro-mechanical knobs. Thus, the virtual touch knob assembly 100 will sense one or more fingers of a user moving around a cylinder and will use that information to control the settings of the appliance or other device.

As can be seen, since the virtual touch knob 110 does not move relative to the front panel 120, there is no concern regarding mechanical wear of the dial components. Since there are no holes in the panel required for mounting the virtual touch knob 110 on the front panel 120, there can be no concern regarding water and/or chemical ingress points to the user interface. Although the figures show a single virtual touch knob 110 on the front panel 120, this is not meant to be limiting, as multiple virtual touch knobs 110 and/or other buttons, switching mechanisms, indicators, etc., may be included on the front panel 120 and still be within the scope of the invention.

In one particular embodiment of the invention, the virtual touch knob would look like a mechanical knob. However, the virtual touch knob would be molded into the panel that holds it (i.e., molded all in one piece). Metallic or other electrically conductive plates P1-P9 are adhered to the inside of the knob, and would be completely hidden from the end user. In one particular embodiment, the plates P1-P8 and P9 are molded into the inside cylindrical body and face of the knob 110, respectively. Alternately, the plates P1-P9 are affixed to the inside surfaces of the knob 110 using an adhesive. The electrically conductive plates or capacitive plates P1-P9 are coupled to a processor, in the present case of FIG. 4, to the microcontroller 130. The microcontroller 130 is configured by software to perform a series of steps based on the states of the plates P1-P9. More particularly, as a user's fingers move across or near the plates P1-P9, the microcontroller 130 would be able to interpret a change in capacitance seen on the plates and determine that the user's fingers are moving across them. A sensed change in plates P1-P8 in the cylindrical body portion of the knob 110, representing an actuation or, or virtual turn of the knob 110, is provided to the appliance or device control 140, which acts on the information to control the operation of the appliance or device, in a similar manner to that performed based on the turning of an electro-mechanical knob. One particular embodiment of a method 300 for determining the direction of a knob "turn" is shown in FIG. 5.

Figure 5:
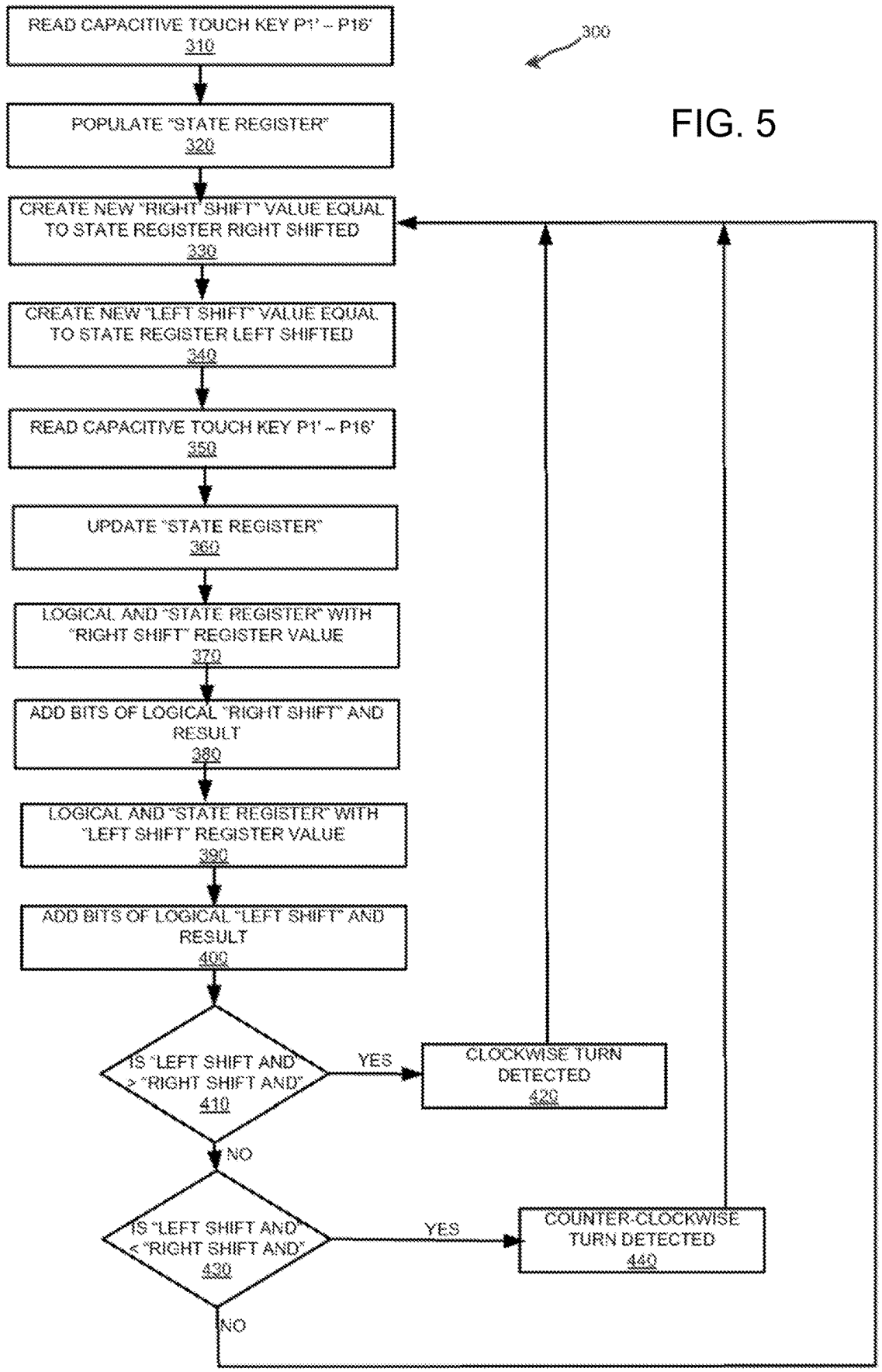
FIG. 5 is a flow diagram of a method for determining a turning direction (i.e., a clockwise or counter-clockwise movement of the user's fingers about the knob) for a virtual touch knob assembly in accordance with one particular embodiment of the invention.
Figure 6:
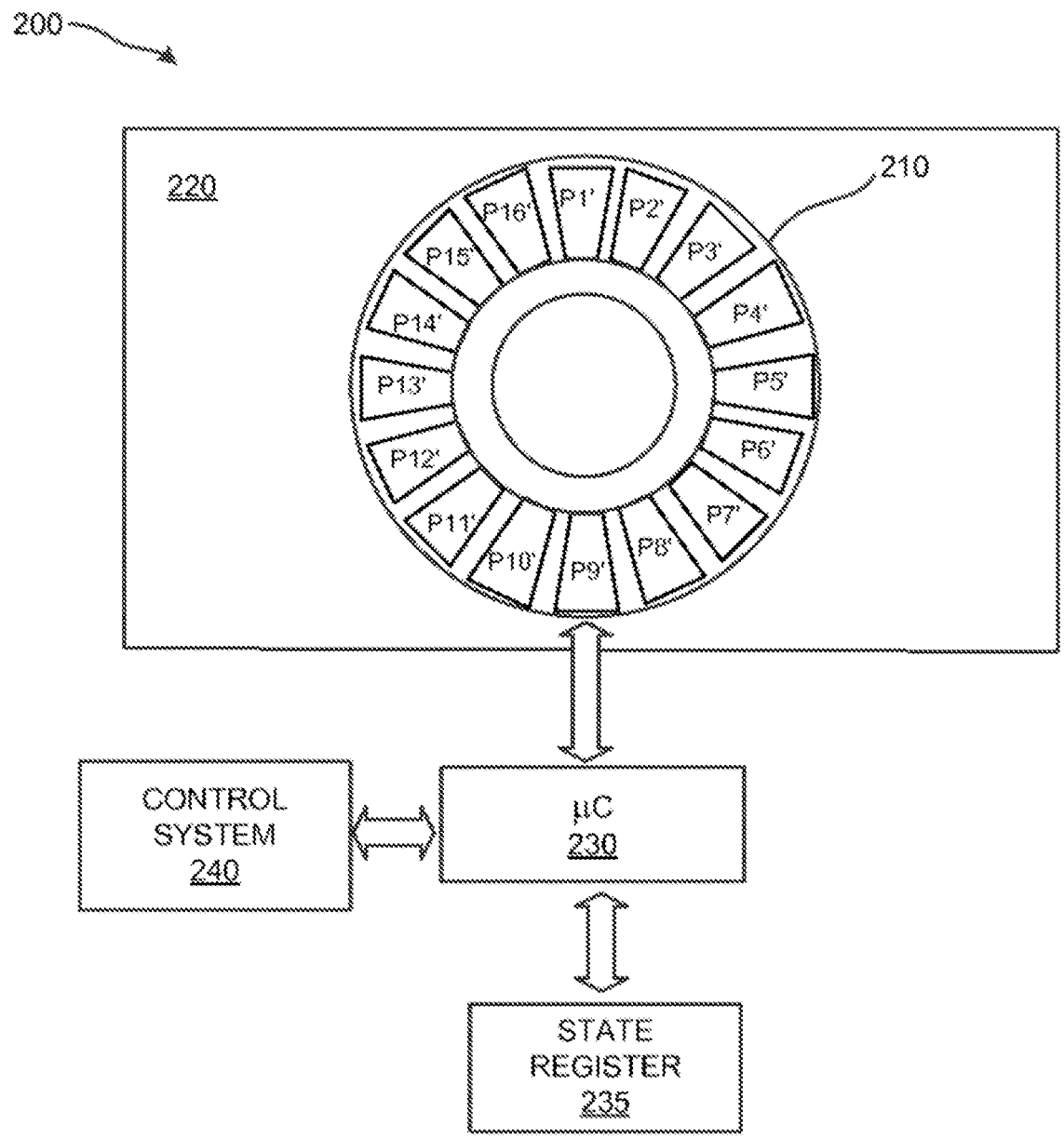
FIG. 6 is a generalized diagram of a virtual touch knob assembly in accordance with another particular embodiment of the invention.

Referring more particularly, to FIGS. 5-6, there will be described one particular exemplary embodiment of the present invention. In particular, a computer processor, such as the microcontroller 230, is configured by software stored in non-transitory memory and executed by the processor to perform the method 300 so as to determine whether a user's fingers are moving clockwise about the virtual touch knob 210, thus signifying a clockwise "turn" of the virtual touch knob 210, or counter-clockwise, signifying a counter-clockwise "turn" of the virtual touch knob 210. More particularly, a virtual touch knob 210, including a knob-like projection having conductive plates P1'-P16' molded around the inside cylindrical perimeter thereof is provided on a user interface panel 220. The virtual touch knob 210 is similar to the knob 110, described in connection with FIGS. 1-4, but with 16 conductive plates/sensors disposed around the inside cylindrical portion of the knob 30 210, instead of the 9 described in connection with FIGS. 1-4. Note that this is not meant to be limiting, as more or fewer conductive plates or sensors can be used without deviating from the spirit of the present invention. It should be noted, however, that a greater number of capacitive sensing elements correlates to a higher resolution or sensitivity regarding the movement of the user's fingers about the circumferential (i.e., cylindrical) surface of the knob 110.

Each of the plates P1'-P16' is tied to an input of the microcontroller 230. Thus, to accommodate the use of 16 capacitive touch sensing plates or keys P1'-P16', the microcontroller 230 would, in one particular example, have a 16 bit I/O port for providing a parallel I/O connection of the microcontroller 230 to each of the plates P1'-P16'. The microcontroller 230 is additionally populates and/or updates a state register 235. Although shown as two separate parts in FIG. 6, it should be understood that the state register could be stored in a separate memory device or cache, or, more preferably, could be maintained in a portion of the memory of the microcontroller 230, as desired. In the present embodiment having 16 touch plates P1'-P16', the state register 235 is a 16 bit register, with 1 bit per key in the order of the physical position of the keys. In accordance with the present embodiment, a "0" bit in a particular one of the 16 bit locations of the state register could indicate that a change in capacitance indicative of a touch has not been sensed in connection with the associated touch plate, while a "1" bit in the particular bit location could indicate that a touch was sensed on the associated plate, or vice-versa.

In operation, the microcontroller 230 cyclically reads each of the 16 capacitive touch keys P1'-P16' (step 310) in a predetermined sequence (i.e., sequentially) and populates the bit location (i.e., 0 bit for no touch, 1 bit for a touch) associated with each key P1'-P16' in the state register 235 (step 320) to indicate whether a change in capacitance (i.e., a touch) was sensed by the microcontroller. Subsequently, the microcontroller 230 creates a "right shift" value equal to the state register (i.e., the 16-bit register in the present embodiment) right shifted, with wrap around (step 330). Similarly, the microcontroller 230 creates a "left shift" value equal to the state register (i.e., the 16-bit register in the present embodiment) left shifted, with wrap around (step 340).

The microcontroller 230 again cyclically reads each of the capacitive touch keys P1'-P16' (step 350), searching for a change in capacitance value of that key, and updates the shift register accordingly (step 360). The bits of the updated state register are then bitwise "ANDed" (i.e., logical AND) with the "right shift" value (step 370) and with the "left shift" value (step 390) by the microcontroller 230. The bits of the logical AND result for each of the "right shift" (step 380) and "left shift" (step 400) are added and the results are compared (steps 410 and 430). If the sum of the "left shift" AND result is greater than the sum of the "right shift" AND result (step 410), then it is determined that the virtual touch knob was "turned" clockwise (i.e., the user's hand moved clockwise around the cylindrical body portion of the knob 210) (step 420). If the sum of the "left shift" AND result is less than the sum of the "right shift" AND result (step 430), then it is determined that the virtual touch knob was "turned" counter-clockwise (i.e., the user's hand moved counter-clockwise around the cylindrical body portion of the knob 210) (step 440). It should be understood, of course, that if the sum of the "left shift" AND result equals the sum of the "right shift" AND result, that the virtual touch knob 210 has not been "turned". The microcontroller 230 provides the result information to the control system 240 for the appliance or device, and the control system utilizes this information to control the settings of the appliance or device in the same way that it would use similar information received from an electro-mechanical knob that turns about a shaft. The microcontroller 230 cyclically performs steps 330-420/440 repetitively during the operation of the device.

For example, in one embodiment of the invention, the virtual touch knob 230 can be used as the volume control knob on the user panel of a radio or other AN device. If the process 300 produces the result that the user's fingers moved about the cylindrical body of the virtual touch knob 210 in a clockwise direction, the control system 240 may increase the volume. Correspondingly, if the process 300 produces the result that the user's fingers moved about the cylindrical body of the virtual touch knob 210 in a counter-clockwise direction, the control system 240 may decrease the volume.

If desired, other modes of operation can be performed with the virtual touch knob assembly of the instant invention. For example, referring back to FIGS. 1-4 of the application, the microcontroller 130 could be programmed to provide direct selection of a setting using the virtual touch knob 110 by sensing the users fingers moving about the electrically conductive plates P1-P8 in the cylindrical body of the knob 110 and/or over the electrically conductive plate P9 in the face of the knob 110. Alternately, the user can "tip" or "tap" the knob 110 on the right, left, top, bottom or other location to indicate a desired setting of the appliance/device. For example, each plate P1-P9 can be associated with a different setting level of the appliance or device, such that if the user taps a particular location on the knob, it can be translated to a desired setting. The microcontroller 130, 230 can distinguish a "tap" from a virtual "turn" of the knob, based on the number of cycles that the change in capacitance existed, and by determining whether the change is localized to a particular plate or region of the virtual touch knob. For example, in a washing machine, dryer or dishwasher, the knob can be used to select between light, normal or heavy loads. Indications of these loads can be marked on the front panel 120 of the user interface, such that, for a light load, the user can tap a portion of the knob adjacent to the indication for a light load. Such a tap would be detected and interpreted by the microcontroller 130 (i.e., signified by, for example, the involvement of only one plate for only one or two cycles) and provided to the control system 140, in order to set the washing machine to operate in a setting for a light load.

Additionally, in another embodiment of the invention, the virtual touch knob assembly, 100, 300 of FIGS. 1-6 can be used to provide a function based generally on an approximation of a touch by the user. For example, the microcontroller 130, 230 can be configured such that, if a finger or a hand of the user approaches any sensor field portion (electrically conductive area) of the knob 110, 210, the microcontroller 130, 230 can detect this action and react with some predefined activity, such as turning on a display or light on the user panel of the appliance or device.

Further, in another particular embodiment, the virtual touch knob assembly 100, 300 can be configured to perform gesture recognition and/or to function as a child lock, if desired. More particularly, every user handles the knob in a different way. A child captures a knob in a different way than an adult. The assembly 100, 300 can be configured (i.e., programmed) to detect whether the knob 110, 210 was actuated by a child or an adult. A microcontroller, such as microcontrollers 130, 230, can differentiate the various shapes of the hands. The present feature can be implemented so that, for example, an oven or stovetop cannot be used by a child. Additionally, if desired, the assembly 100, 300 can be configured by the administrator to require a special gesture to activate operation. For example, the assembly 100, 300 can be programmed to require that the virtual touch knob be tapped twice on the left side and three times on the top in order to initiate operation of the appliance or device. If a user does not know the special gesture or code, the control system 140, 240 will lock any changes of the level settings.

The virtual touch knob assembly described herein can be used on a variety of household appliances or other electrical devices, including, but not limited to, a refrigerator, freezer, washing machine, dryer, dishwasher, oven, stove, microwave, rice or bread maker, radio, television, audio and/or video equipment, etc. Although the invention is illustrated and described herein as embodied in a virtual touch knob assembly, it is nevertheless not intended to be limited to only these details shown, as various modifications and structural changes may be made therein without departing from the spirit of the invention and within the scope and range of equivalents of the claims.

The invention claimed is:

1. A virtual touch knob assembly, comprising:
a knob including a cylindrical body protruding from a front panel of a user interface and a plurality of conductive plates disposed around a cylindrical perimeter of the cylindrical body;
a processor configured to read each of the plurality of conductive plates in a predetermined sequence and to determine whether a capacitance level has changed for one or more of said conductive plates;
said processor configured to store in a state register, for each of said plurality of conductive plates, a value indicative of whether or not a capacitance level changed for a respective one of said plurality of conductive plates and, based on the values in said state register, to determine a turning direction of said knob, said state register including a bit register for storing a state of each conductive plate of said plurality of conductive plates;
wherein said processor determines a turning direction of said knob by:
creating a right shift value by right shifting the state register values with wrap around;

creating a left shift value by left shifting the state register values with wrap around;

performing a further read of said plurality of conductive plates and updating the state register based on said further read of said plurality of conductive plates;

logically ANDing said updated state register value with said right shift register value to produce a right shift AND result represented in bits;

logically ANDing said updated state register value with said left shift register value to produce a left shift AND result represented in bits;

adding the bits of the right shift AND result to produce a right shift AND result sum;

adding the bits of the left shift AND result to produce a left shift AND result sum; and determining a clockwise turning direction of the knob if said left shift AND result sum is greater than said right shift AND result sum, a counter-clockwise turning direction of the knob if said right shift AND result sum is greater than said left shift AND result sum, or that the knob has not been turned if said left shift AND result sum is equal to said right shift AND result sum.

2. The virtual touch knob assembly according to claim 1, wherein said turning direction is determined based on whether a sum of the bits of said left shift AND result is greater or less than a sum of the bits of said right shift AND result.

3. The virtual touch knob assembly according to claim 2, wherein the turning direction is determined to be clockwise if the sum of the bits of said left shift AND result is greater than the sum of the bits of said right shift AND result.

4. The virtual touch knob assembly according to claim 2, wherein the turning direction is determined to be counter-clockwise if the sum of the bits of said left shift AND result is lower than the sum of the bits of said right shift AND result.

5. The virtual touch knob assembly according to claim 1, wherein the knob is molded to a front panel of a user interface of an appliance or device.

6. The virtual touch knob assembly according to claim 1, wherein the plurality of conductive plates are molded into the knob.

7. The virtual touch knob assembly according to claim 1, wherein the plurality of conductive plates is 16 plates and wherein the state register is 16 bits in length.

8. The virtual touch knob assembly according to claim 1, wherein the processor is additionally configured to determine when a particular location on the knob has been tapped by determining if the capacitance level has changed for only one plate of said plurality of conductive plates for only one reading sequence or only two reading sequences of said plurality of conductive plates.

9. A method for determining a turning direction of a virtual touch knob assembly, comprising the steps of:

providing a knob including a cylindrical body protruding from a front panel of a user interface and a plurality of conductive plates disposed around a cylindrical perimeter of the cylindrical body;

reading each of the plurality of conductive plates in a predetermined sequence and determining whether a capacitance level has changed for one or more of the conductive plates;

storing in a state register, for each of the plurality of conductive plates, a value indicative of whether or not a capacitance level changed for a respective one of the plurality of conductive plates and, based on the values in the state register, determining a turning direction of the knob, the state register including a bit register for storing a state of each conductive plate of said plurality of conductive plates;

determining a turning direction of the knob by:
creating a right shift value by right shifting the state register values with wrap around;

creating a left shift value by left shifting the state register values with wrap around;

performing a further read of the plurality of conductive plates and updating the state register based on the further read of the plurality of conductive plates;

producing a right shift AND result, represented in bits, by logically ANDing the updated state register value with the right shift register value;

producing a left shift AND result, represented in bits, by logically ANDing the updated state register value with the left shift register value;

adding the bits of the right shift AND result to produce a right shift AND result sum;

adding the bits of the left shift AND result to produce a left shift AND result sum; and determining a clockwise turning direction of the knob if said left shift AND result sum is greater than said right shift AND result sum, a counter-clockwise turning direction of the knob if said right shift AND result sum is greater than said left shift AND result sum, or that the knob has not been turned if said left shift AND result sum is equal to said right shift AND result sum.

10. The method according to claim 9, wherein the turning direction is determined based on whether a sum of the bits of the left shift AND result is greater or less than a sum of the bits of the right shift AND result.

11. The method according to claim 10, wherein the turning direction is determined to be clockwise if the sum of the bits of the left shift AND result is greater than the sum of the bits of the right shift AND result.

12. The method according to claim 10, wherein the turning direction is determined to be counter-clockwise if the sum of the bits of the left shift AND result is lower than the sum of the bits of the right shift AND result.

13. The method according to claim 9, wherein the knob is molded to a front panel of a user interface of an appliance or device.

14. The method according to claim 9, wherein the plurality of conductive plates are molded into the knob.

15. The method according to claim 9, wherein the plurality of conductive plates is 16 plates and wherein the state register is 16 bits in length.

16. The method according to claim 9 further comprising the step of determining, based on a sensed change in capacitance, that a particular position on the knob has been tapped by determining if the capacitance level has changed for only one plate of said plurality of conductive plates for only one reading sequence or only two reading sequences of said plurality of conductive plates.

* * * * *